(12) United States Patent
Nakanishi et al.

(10) Patent No.: US 6,548,828 B2
(45) Date of Patent: Apr. 15, 2003

(54) THIN-FILM TRANSISTOR AND METHOD OF MANUFACTURING THIN-FILM TRANSISTOR WITH TAPERED GATE OF 20 DEGREES OR LESS

(75) Inventors: Shiro Nakanishi, Ohgaki (JP); Kiyoshi Yoneda, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/162,208

(22) Filed: Sep. 28, 1998

(65) Prior Publication Data

US 2002/0063255 A1 May 30, 2002

(30) Foreign Application Priority Data

Sep. 30, 1997 (JP) .............................. 9-266707

(51) Int. Cl.$^7$ .............................................. H01L 29/00
(52) U.S. Cl. ......................................... 257/59; 357/347
(58) Field of Search ................................ 257/347–355, 257/59, 72

(56) References Cited

U.S. PATENT DOCUMENTS

| | | | |
|---|---|---|---|
| 5,130,772 A | 7/1992 | Choi | |
| 5,162,892 A | 11/1992 | Hayashi et al. ................ 257/65 |
| 5,164,805 A | * 11/1992 | Lee | |
| 5,200,846 A | * 4/1993 | Hiroki et al. ................. 257/59 |
| 5,296,729 A | 3/1994 | Yamanaka et al. | |
| 5,440,168 A | 8/1995 | Nishimura et al. | |
| 5,468,986 A | 11/1995 | Yamanashi | |
| 5,534,445 A | 7/1996 | Tran et al. .................... 437/21 |
| 5,545,576 A | 8/1996 | Matsumoto et al. ........... 437/41 |
| 5,616,933 A | 4/1997 | Li | |
| 5,641,974 A | 6/1997 | den Boer et al. ............. 257/59 |
| 5,693,541 A | 12/1997 | Yamazaki et al. ............. 437/21 |
| 5,707,746 A | 1/1998 | Yaoi et al. ................. 428/448 |
| 5,837,619 A | 11/1998 | Adachi et al. ............. 438/795 |
| 5,880,018 A | 3/1999 | Boeck et al. ............. 438/619 |
| 5,885,858 A | 3/1999 | Nishimura et al. | |
| 5,917,225 A | 6/1999 | Yamazaki et al. | |
| 5,917,571 A | 6/1999 | Shimada ..................... 349/138 |
| 5,930,657 A | 7/1999 | Kim et al. .................. 438/482 |
| 5,933,205 A | * 8/1999 | Yamazaki et al. | |
| 6,022,764 A | 2/2000 | Park et al. .................... 438/151 |
| 6,034,747 A | 3/2000 | Tanaka et al. ................ 349/43 |
| 6,128,060 A | 10/2000 | Shimada et al. ............. 349/138 |
| 6,140,668 A | 10/2000 | Mei et al. ..................... 257/66 |
| 6,147,667 A | * 11/2000 | Yamazaki et al. ............. 257/59 |
| 6,150,692 A | 11/2000 | Iwanaga et al. .............. 257/315 |
| 6,188,458 B1 | 2/2001 | Tagusa et al. .............. 349/138 |
| 6,229,156 B1 | 5/2001 | Murai et al. ................... 257/57 |

FOREIGN PATENT DOCUMENTS

| | | |
|---|---|---|
| JP | 358137215 A | 8/1983 |
| JP | 1032678 | 2/1989 |
| JP | 401053559 A | 3/1989 |
| JP | 4239731 | 8/1992 |
| JP | 7162008 | 6/1995 |
| JP | 9082982 | 3/1997 |

OTHER PUBLICATIONS

Wolf, Silicon Processing for the VLSI Era, vol. 1, 1986, p. 522.

* cited by examiner

*Primary Examiner*—Fetsum Abraham
(74) *Attorney, Agent, or Firm*—Cantor Colburn LLP

(57) ABSTRACT

On a substrate, there is disposed a gate electrode having a section of a trapezoidal configuration expanded toward the substrate. The gate electrode is covered with a silicon nitride film having a thickness T1 of 400 Å, and a silicon oxide film having a thickness T2 of 1200 Å is formed on the silicon nitride film. A polycrystalline silicon film constructing an active region is formed on a gate insulating film constituted of the silicon nitride film and the silicon oxide film. By forming the silicon oxide film in a sufficient thickness of 1200 Å or more, and further forming the silicon nitride film 23 of 400 Å or more, a thin-film transistor cannot easily be influenced by a stepped portion formed by the gate electrode, and withstanding voltage of the gate insulating film of the thin-film transistor can be enhanced.

4 Claims, 6 Drawing Sheets

THIN-FILM TRANSISTOR AND METHOD OF MANUFACTURING THIN-FILM TRANSISTOR WITH TAPERED GATE OF 20 DEGREES OR LESS

BACKGROUND OF THE INVENTION

1. Field of the Invention

The present invention relates to a thin-film transistor, for example, a bottom gate type thin-film transistor suitable for a pixel displaying switching element of an active matrix system display panel or the like and to a manufacturing method thereof.

2. Description of the Prior Art

FIG. 1 is a sectional view showing a structure of a bottom gate type thin-film transistor.

A gate electrode 2 constituted of a high-melting metal (refractory metal) such as tungsten, chromium, or the like is formed on a surface of an insulating transparent substrate 1. The gate electrode 2 has opposite ends enlarged toward the transparent substrate 1 to form a tapered configuration. A silicon oxide film 4 is deposited via a silicon nitride film 3 on the transparent substrate 1 with the gate electrode 2 formed thereon. The silicon nitride film 3 inhibits impurities contained in the transparent substrate 1 from penetrating an active region described later, while the silicon oxide film 4 works as a gate insulating film. A polycrystalline silicon layer 5 is deposited on the silicon oxide film 4 in such a manner that the film 5 extends across the gate electrode 2. The polycrystalline silicon layer 5 forms the active region of the thin-film transistor.

A stopper 6 formed of a silicon oxide or another insulating material is disposed on the polycrystalline silicon layer 5. A portion of the polycrystalline silicon layer 5 covered with the stopper 6 forms a channel region 5c, and the other portions of the polycrystalline silicon layer 5 form a source region 5s and a drain region 5d. Laminated on the polycrystalline silicon layer 5 with the stopper 6 formed thereon are a silicon oxide film 7 and a silicon nitride film 8. The silicon oxide film 7 and the silicon nitride film 8 construct an interlayer insulating film to protect the polycrystalline silicon layer 5 including the source region 5s and the drain region 5d.

Contact holes 9 are formed at predetermined positions of the silicon oxide film 7 and the silicon nitride film 8 on the source region 5s and the drain region 5d. A source electrode 10s and a drain electrode 10d are disposed in the contact holes 9, and connected to the source region 5s and the drain region 5d, respectively. An acrylic resin layer 11 transparent to visible light is formed on the silicon nitride film 8 with the source electrode 10s and the drain electrode 10d formed therein. The acrylic resin layer 11 fills in surface asperities generated by the gate electrode 2 and the stopper 6 to flatten a surface.

A contact hole 12 is formed in the acrylic resin layer 11 on the source electrode 10s. A transparent electrode 13 made of ITO (Indium Tin Oxide) or the like connected to the source electrode 10s via the contact hole 12 is disposed to spread over the acrylic resin layer 11. The transparent electrode 13 constitutes a pixel electrode of a liquid crystal display panel.

A plurality of the aforementioned thin-film transistors are arranged together with the pixel electrodes in a matrix on the transparent substrate 1, and apply to the pixel electrodes image data supplied to the drain electrodes 10d in response to a scanning control signal applied to the gate electrodes 2.

Additionally, a crystal particle diameter of the polycrystalline silicon layer 5 is preferably formed to a sufficient size so that the film 5 functions as the active region of the thin-film transistor. As a method of forming the polycrystalline silicon layer 5 with a large crystal particle diameter, a laser annealing method using an excimer laser is known. In the laser annealing method, silicon in an amorphous state is formed on the silicon oxide film 4 constituting the gate insulating film, an excimer laser is irradiated to the silicon to temporarily melt the silicon, and the silicon is crystallized. When the laser annealing method is used, a temperature of the transparent substrate 1 does not need to be raised. Therefore, a low-melting glass substrate can be used as the transparent substrate 1.

The silicon oxide film 4 forming the gate insulating film is formed to cross over a step generated by the gate electrode 2. In this case, the gate electrode 2 has a section formed in a trapezoidal shape in such a manner that its side wall forms an acute angle with a surface of the transparent substrate 1, but insulation defect of the gate insulating film easily occur in the stepped portion. This is because the silicon oxide film 4 formed in a plasma CVD process has a coarser or non-dense quality compared with a silicon oxide film formed by a high-temperature thermal oxidation processing, and even its slightly bent portion may not maintain withstanding voltage. Therefore, a problem arises that current leakage occurs between the gate electrode 2 and the active region which is polycrystalline silicon layer 5, operating characteristics are deteriorated, and an inoperable state is caused in an extreme case.

SUMMARY OF THE INVENTION

An object of the present invention is to prevent insulation defects from arising in a gate insulating film.

To attain this and other objects, the present invention provides a thin-film transistor which comprises a gate electrode disposed on a substrate, a gate insulating film formed on the substrate to cover the gate electrode, a semiconductor film formed on the gate insulating film to cross over the gate electrode, and an interlayer insulating film formed on the semiconductor film. The gate electrode is expanded in width toward the substrate, and the gate insulating film is provided with a silicon oxide film having a thickness of at least 1200 Å.

Moreover, in another aspect of the present invention, a silicon nitride film having a thickness of at least 400 Å is formed between the substrate and the silicon oxide film.

According to another aspect of the present invention, a method of manufacturing a thin-film transistor includes a first step of forming a gate electrode on a main surface of a substrate, a second step of forming a gate insulating film on the substrate to cover the gate electrode, a third step of forming a semiconductor film on the gate insulating film to cross over the gate electrode, and a fourth step of forming an interlayer insulating film on the semiconductor film. In the first step, the gate electrode is expanded in width toward the substrate, and in the second step, the silicon oxide film is formed to a thickness of at least 1200 Å.

According to the present invention, since the silicon oxide film constituting the gate insulating film is formed in a thickness of 1200 Å or more, a stepped portion formed by the gate electrode is completely covered, and insulation defects of the gate insulating film can be reduced. Furthermore, since the silicon nitride film is formed in a thickness of 400 Å or more between the substrate and the silicon oxide film, deposition of impurities from the substrate is inhibited. Moreover, since the film is dense, the stepped portion formed by the gate electrode is moderated, and a flatter film surface is formed. Therefore, insulating strength (withstanding voltage) of the silicon oxide film formed in an upper layer can further be enhanced.

As aforementioned, according to the present invention, the withstanding voltage of the gate insulating film can be enhanced, and the current leakage between the gate electrode and the active region can be reduced. Therefore, not only manufacturing yield but also reliability can be improved.

DESCRIPTION OF THE PREFERRED EMBODIMENT

Figure 2:
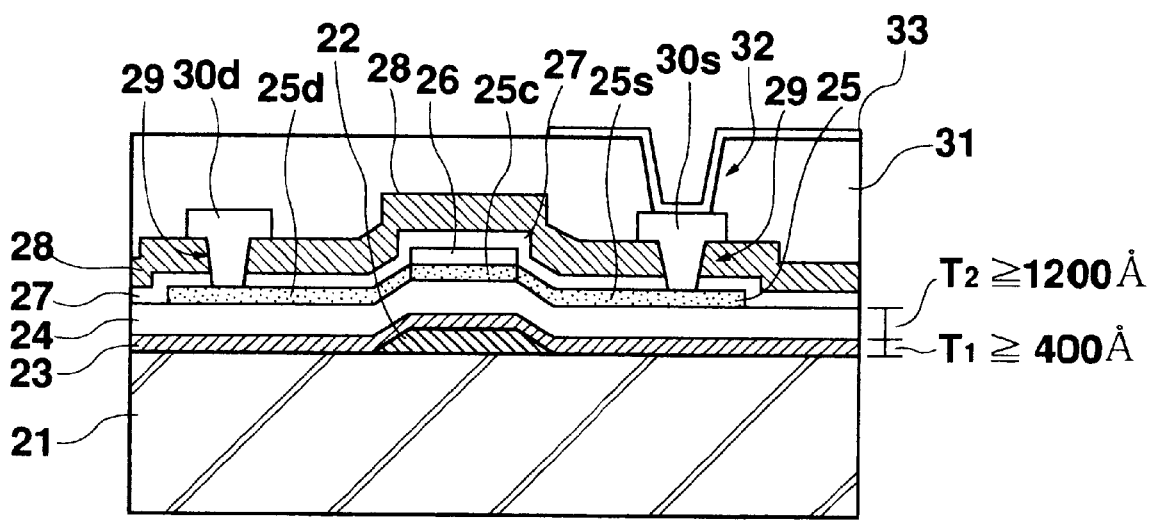
FIG. 2 is a sectional view showing a structure of a thin-film transistor of the present invention.

FIG. 2 is a sectional view showing a structure of a thin-film transistor of the present invention.

A gate electrode 22 is disposed on a transparent substrate 21. The gate electrode 22 has a tapered shape by taper eching so that its width increases toward the transparent substrate 21, and extends across a transistor forming region. Here, in the sectional configuration of the gate electrode 22, a crossing angle of a side wall and a bottom face (a surface of the transparent substrate 21) is 20° or less, that is, a bottom angle of the trapezoidal section of the gate electrode 22 is 20° or less. Furthermore, its thickness is preferably about 1000 Å. On the transparent substrate 21 with the gate electrode 22 disposed thereon, a silicon nitride film 23 is deposited to a predetermined thickness (T1≧400 Å) to cover the gate electrode 22. The silicon nitride film 23 inhibits incursion of impurity ions from the transparent substrate 21. It is confirmed by experiment that the silicon nitride film 23 functions sufficiently with a thickness of 400 Å. Subsequently, a silicon oxide film 24 is deposited to a predetermined thickness (T2≧1200 Å) on the silicon nitride film 23. The silicon nitride film 23 and the silicon oxide film 24 form a gate insulating film.

A polycrystalline silicon film 25 as a semiconductor film forming an active region is formed on the gate insulating film constituted of the silicon nitride film 23 and the silicon oxide film 24 to overlap the gate electrode 22. The polycrystalline silicon film 25 is formed in an island shape to cross over the gate electrode 22. On the polycrystalline silicon film 25 there is formed a stopper 26 constituted of a silicon oxide. A region of the polycrystalline silicon film 25 covered with the stopper 26 forms a channel region 25c, and other regions of the polycrystalline silicon film 25 construct a source region 25s and a drain region 25d. An interlayer insulating film constituted of two layers of a silicon oxide film 27 and a silicon nitride film 28 is formed on the polycrystalline silicon film 25 with the stopper 26 formed thereon. The silicon oxide film 27 prevents contact of the polycrystalline silicon film 25 and the silicon nitride film 28, while the silicon nitride film 28 supplies hydrogen ions to the polycrystalline silicon film 25 in process of manufacture.

Figure 1:
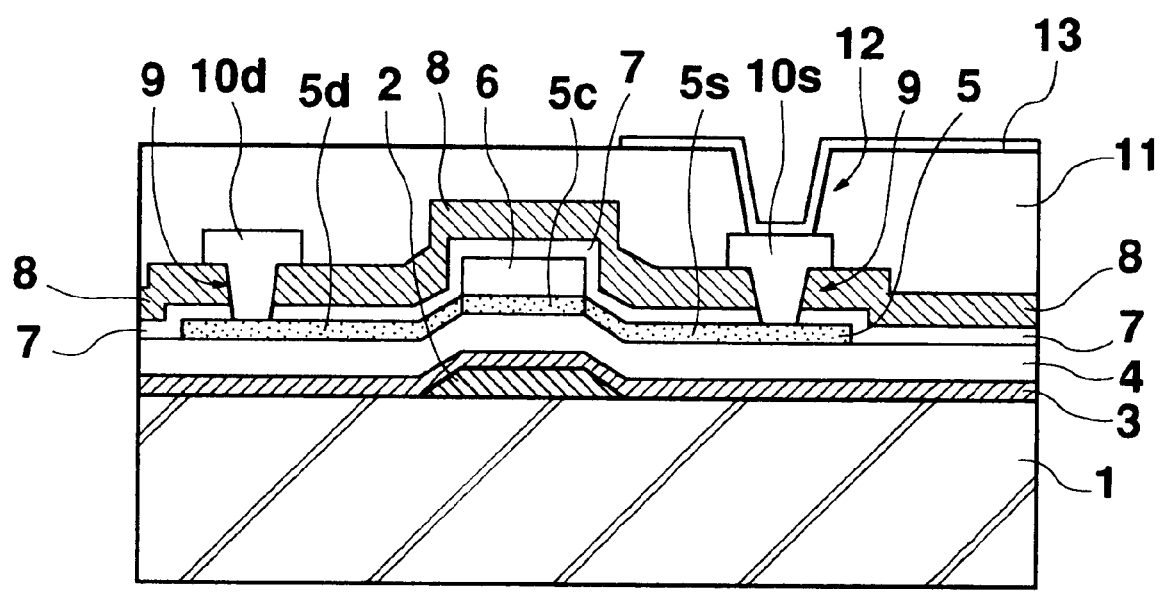
FIG. 1 is a sectional view showing a structure of a conventional thin-film transistor.

Contact holes 29 are formed in the interlayer insulating film to reach the polycrystalline silicon film 25. A source electrode 30s and a drain electrode 30d to be connected to the source region 25s and the drain region 25d are formed on portions of the contact holes 29. Moreover, an acrylic resin layer 31 is formed on the silicon nitride film 28 to cover the source electrode 30s and the drain electrode 30d and to flatten a surface. Furthermore, a contact hole 32 is formed in the acrylic resin layer 31 to reach the source electrode 30s, and a transparent electrode 33 to be connected to the source electrode 30s is formed to spread over the acrylic resin layer 31. The source electrode 30s, the drain electrode 30d and the transparent electrode 33 are the same as the source electrode 10s, the drain electrode 10d and the transparent electrode 13 shown in FIG. 1.

In the thin-film transistor described above, since the gate insulating film is constituted by overlapping the silicon nitride film 23 with a thickness of 400 Å and the silicon oxide film 24 with a thickness of 1200 Å, the insulation defect of the gate insulating film can be remarkably reduced. It is confirmed by measurement that a manufacturing reject rate resulting from the insulation defect of the gate insulating film is reduced from about 25% to about 4% compared with a case where the gate insulating film is constructed with single silicon oxide film with a thickness of 1000 Å.

FIGS. 3A to 3F are sectional views showing processes 3A to 3F of a manufacture method of the thin-film transistor according to the present invention. The same portion as shown in FIG. 2 is shown in these figures.

(a) Process 3A

On the insulating transparent substrate 21, chromium, molybdenum, Al, Al alloy, or another high-melting metal is formed to a thickness of 1000 Å by a sputtering process, or by an anodizing process or other methods when aluminum or aluminum alloy is employed, to form a high-melting metal film 34. The high-melting metal film 34 is formed into a predetermined configuration by patterning to form the gate electrode 22. In the patterning processing, the section of the gate electrode 22 is formed in a tapered configuration expanded toward the transparent substrate 21 by taper etching. In the gate electrode 22, a crossing angle of a side wall and a bottom face (a surface of the transparent substrate 21) is set to 20° or less. Examples of the taper etching process include a process in which adhesion of a resist acting as an etching mask and the high-melting metal film 34 is lowered, a process in which a film high in etching rate is formed on a surface of the high-melting metal film 34, and the like.

(b) Process 3B

Silicon nitride is deposited to a thickness of 400 Å or more on the transparent substrate 21 by the plasma CVD process. This forms the silicon nitride film 23 for inhibiting the incursion of impurity ions from the transparent substrate 21. Subsequently, silicon oxide is deposited to a thickness of 1200 Å or more on the silicon nitride film 23 by the plasma CVD process. The silicon oxide film 24 which acts the gate insulating film together with the silicon nitride film 23 is thereby formed. Subsequently, silicon is deposited to a thickness of 400 Å on the silicon oxide film 24 by the plasma CVD process to form an amorphous silicon film 25a. The silicon nitride film 23, the silicon oxide film 24, and the amorphous silicon film 25a can be continuously formed by the same manufacturing apparatus. Furthermore, by performing thermal processing at about 430° C. for one hour or more, hydrogen in a silicon film 25a is expelled from the film. After the hydrogen concentration becomes 1 atomic % or less, an excimer laser is irradiated to the silicon film 25a to heat the silicon in an amorphous state until the silicon is fused. The silicon is thereby crystallized to form the polycrystalline silicon film 25.

(c) Process 3C

Silicon oxide is deposited to a thickness of 1000 Å on the polycrystalline silicon film 25 to form a silicon oxide film 35. The silicon oxide film 35 is patterned to the predetermined configuration corresponding to the gate electrode 22 to form the stopper 26 overlapping the gate electrode 22. When the stopper 26 is formed, a resist layer is formed to cover the silicon oxide film 35, and exposed to light from the back side of the transparent substrate 21 using the gate electrode 22 as a mask. In this case, the mask can be prevented from being dislocated.

(d) Process 3D

Corresponding to the type of the transistor to be formed, P-type or N-type impurity ions are doped to the polycrystalline silicon film 25 on which the stopper 26 is formed. Specifically, in a case where a P channel type transistor is formed, boron or other P-type ions are doped. In a case where an N channel type transistor is formed, phosphorus or other N-type ions are doped. By the doping, regions indicative of a P-type or N-type conductivity are formed on the polycrystalline silicon film 25 except at a region covered with the stopper 26. These regions construct the source region 25s and the drain region 25d on sides of the stopper 26.

(e) Process 3E

Excimer laser is irradiated to the polycrystalline silicon film 25 with the source region 25s and the drain region 25d formed thereon to heat to a temperature at which the silicon is not melt. The impurity ions in the source region 25s and the drain region 25d are thereby activated. Subsequently, the polycrystalline silicon film 25 is formed in an island shape by patterning while predetermined widths are left on the sides of the stopper 26 (gate electrode 22), so that the transistor is separated/isolated.

(f) Process 3F

Silicon oxide is deposited to a thickness of 1000 Å on the polycrystalline silicon film 25 by the plasma CVD process, and silicon nitride is continuously deposited to a thickness of 3000 Å. This forms the interlayer insulating film constituted of two layers of the silicon oxide film 27 and the silicon nitride film 28. After forming the silicon oxide film 27 and the silicon nitride film 28, heating is performed in a nitrogen atmosphere, so that hydrogen ions contained in the silicon nitride film 28 are introduced to the polycrystalline silicon film 25. The temperature of the heating processing needs to be set in a range in which hydrogen ions sufficiently move and the transparent substrate 21 is not damaged, and a range of 350 to 450° C. is appropriate. Since hydrogen ions contained in the silicon nitride film 28 are introduced into the polycrystalline silicon film 25 through the silicon oxide film 27 which is formed thin in accordance with the thickness of the silicon nitride film 28, a necessary amount of hydrogen ions are securely supplied to the polycrystalline silicon film 25. Crystal defects in the polycrystalline silicon film 25 are thus filled with the hydrogen ions.

After rectifying the crystal defects in the polycrystalline silicon film 25 using the hydrogen ions, the contact holes 29 penetrating the silicon oxide film 27 and the silicon nitride film 28 are formed in positions corresponding to those of the source region 25s and the drain region 25d, and the source electrode 30s and the drain electrode 30d each formed of aluminum or another metal are formed in the contact holes 29 as shown in FIG. 2. The source electrode 30s and the drain electrode 30d are formed, for example, by patterning aluminum sputtered on the silicon nitride film 28 with the contact holes 29 formed therein.

Subsequently, acrylic resin solution is applied onto the silicon nitride film 28 on which the source electrode 30s and the drain electrode 30d are formed, and baked to form the acrylic resin layer 31 of FIG. 2. The acrylic resin layer 31 fills in surface asperities formed by the stopper 26, the source electrode 30s and the drain electrode 30d for planerization of the surface. Furthermore, the contact hole 32 extending through the acrylic resin layer 31 is formed on the source electrode 30s, and the transparent electrode 33 of ITO or the like to be connected to the source electrode 30s is formed in the contact hole 32. The transparent electrode 33 is formed, for example, by patterning ITO sputtered on the acrylic resin layer 31 with the contact hole 32 formed therein.

By the aforementioned processes 3A to 3F, the bottom gate type thin-film transistor having the structure shown in FIG. 2 is formed.

Figure 4:
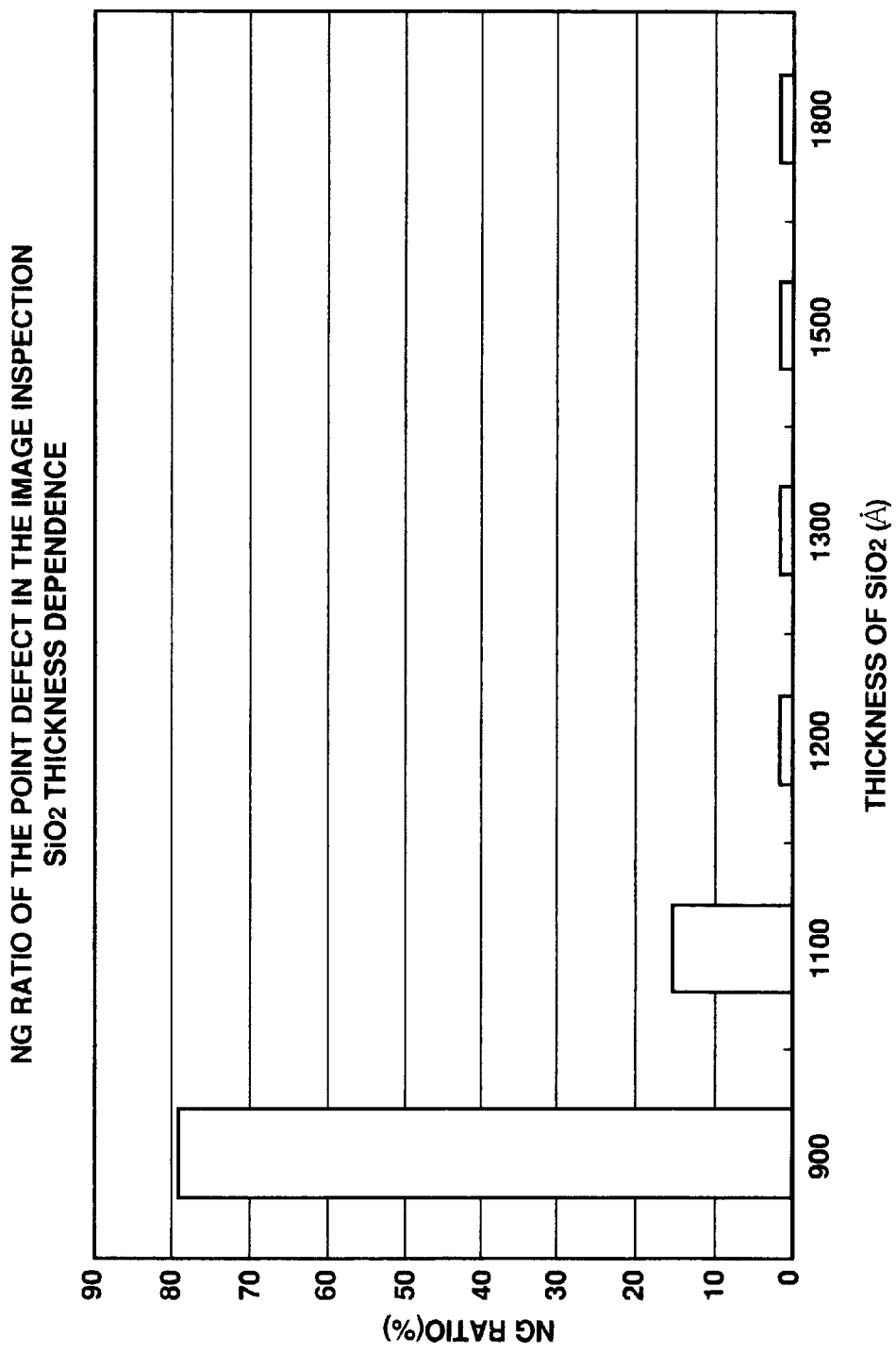
FIG. 4 is a graph showing the relationship between the NG rate of the point defect in the image inspection and $SiO_2$ thickness.
Figure 5:
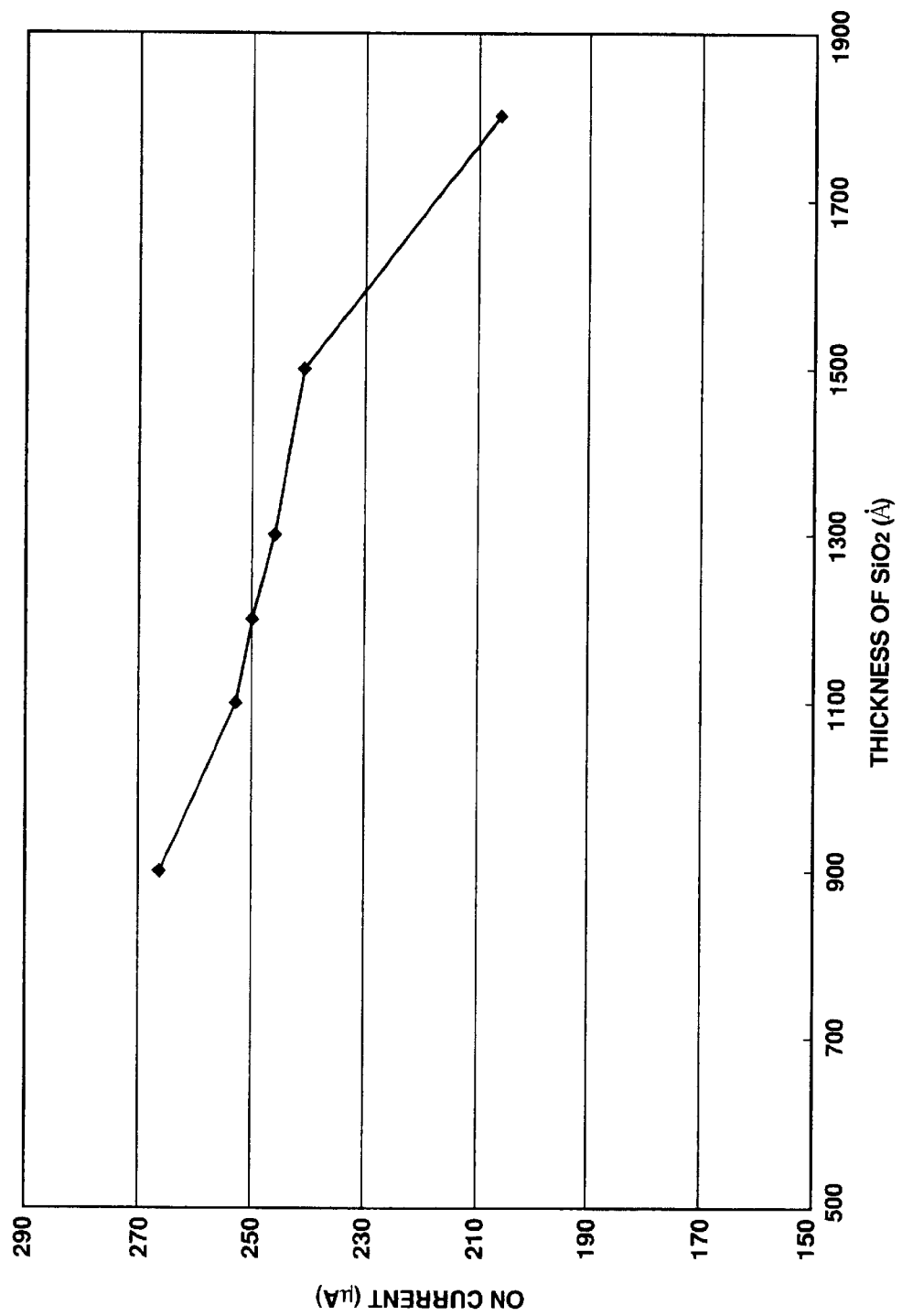
FIG. 5 is a graph showing the relationship between the on current of the thin-film transistor and $SiO_2$ thickness.

FIG. 4 shows measurement results of NG ratio when the thickness of the gate insulating film ($SiO_2$) is changed, and FIG. 5 shows measurement results of ON current when the thickness of the gate insulating film ($SiO_2$) is changed. Here, NG indicates a result of observation of bright point generation ratio. When 5V is applied to a pixel electrode and a common electrode, in a normally white mode LCD resulting in black display, a bright point displayed white because of electric charge leakage appears. In this case, it is judged NG. Moreover, ON current of a TFT is shown in a line graph.

As will be clearly seen from the figures, the bright point generation ratio rapidly decreases from the vicinity of a thickness 1000 Å of the gate insulating film ($SiO_2$), and becomes very small with a thickness of 1200 Å or more.

However, ON current decreases following the increase of the thickness of the gate insulating film. In design, a dispersion of ON current needs to be within ±10%. If the maximum current value is 250 $\mu$A at the thickness of 1200 Å, the minimum current value is about 205 $\mu$m at the thickness of 1800 Å.

The graphs show that the thickness of the gate insulating film ($SiO_2$) is preferably 1800 Å or less. Therefore, a desirable thickness of the gate insulating film is about 1200 Å to 1800 Å.

Figure 3A:
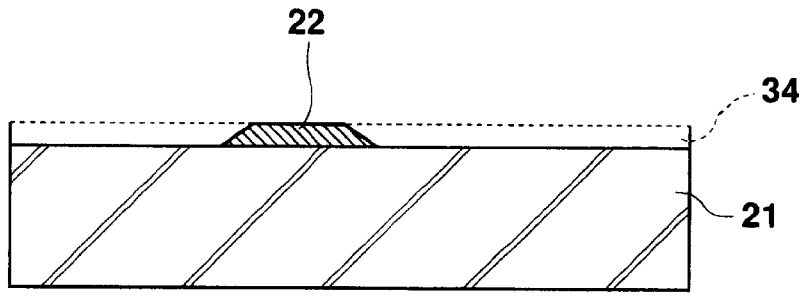
FIGS. 3A, 3B, 3C, 3D, 3E, and 3F are sectional views showing processes of a method for manufacturing the thin-film transistor of the present invention.
Figure 3B:
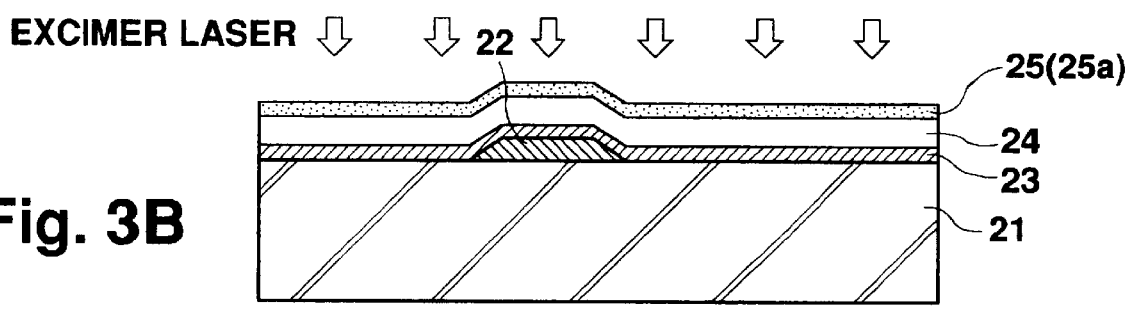
Figure 3C:
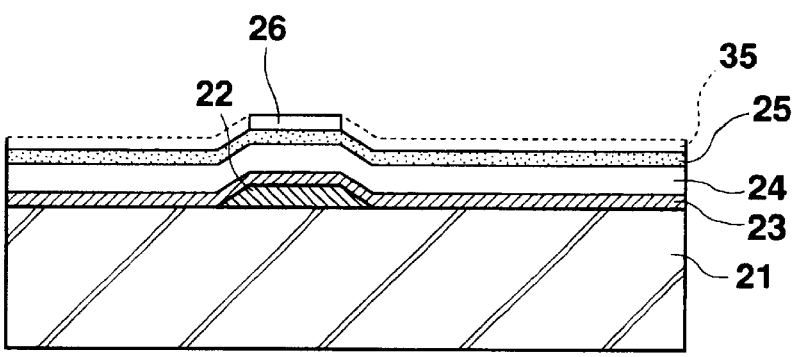
Figure 3D:
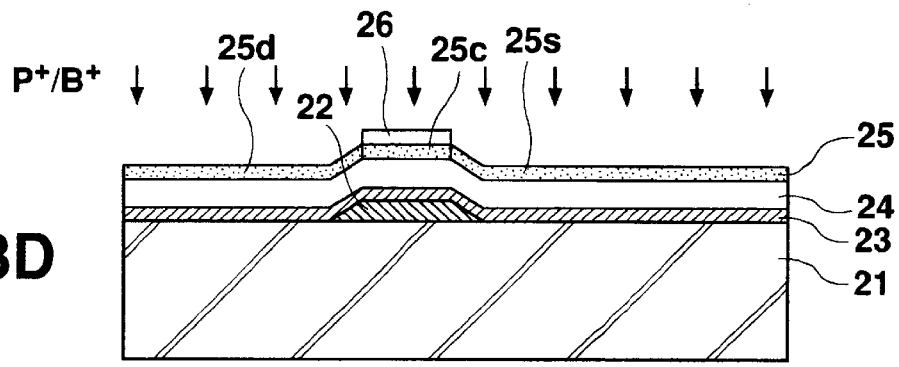
Figure 3E:
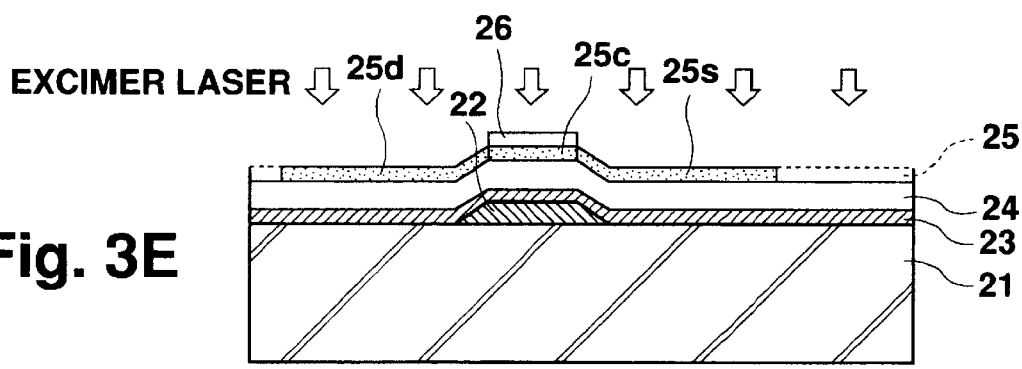
Figure 3F:
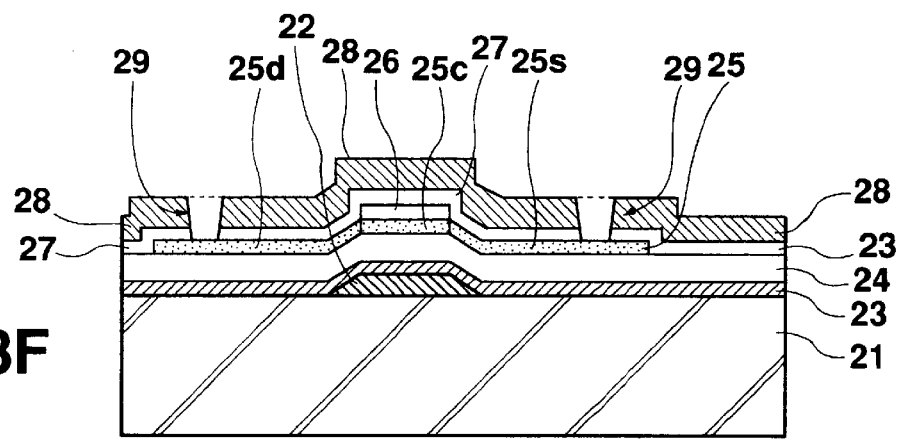

Additionally, in FIGS. 3B and 3E, characteristic laser annealing is performed. The laser annealing is effective for the gate insulating film. In general, for $SiO_2$ formed by the plasma CVD process, a main material of silane gas is subjected to chemical reaction to generate $SiO_2$. Therefore, unreacted substances exist in the film, and the film itself is non-dense. If this $SiO_2$ is used in the gate insulating film as it is, in consideration of film leakage characteristics, a remarkably thick film needs to be formed. However, by the laser annealing in which a-Si is converted to poly-Si, the gate insulating film is also annealed, the unreacted substances are converted, and the film can be made dense. The gate insulating film can be formed thinner compared with a film which is not subjected to the laser annealing. Specifically, the densification of the gate insulating film can be realized by the laser annealing. FIGS. 4 and 5 show data of film quality measured after the laser annealing.

Additionally, the thickness of each section described in the above embodiment is an optimum value in specific conditions, and values are not limited to those of the embodiment. If the thickness T1 of the silicon nitride film 23 and the thickness T2 of the silicon oxide film 24, the films constituting the gate insulating film, satisfy the above-mentioned conditions (T1≧400 Å, T2≧1200 Å), the thickness of any other section or film can be set to an arbitrary value.

What is claimed is:

1. A thin-film transistor which comprises:

a gate electrode formed on a substrate;

a gate insulating film formed on said substrate to cover said gate electrode;

a semiconductor film formed on said gate insulating film to cross over said gate electrode; and an interlayer insulting film formed on said semiconductor film, wherein, said gate electrode is expanded in width toward said substrate such that said gate electrode forms a trapezoidal cross section, a base angle of said trapezoidal cross section is 20 degrees or less, said gate insulating film is provided with a silicon oxide film having a thickness of at least 1200 Å, and said semiconductor film is a polycrystalline semiconductor film obtained from polycrystallization of an amorphous semiconductor film by a laser annealing.

2. The thin-film transistor according to claim 1 wherein a silicon nitride film having a thickness of at least 400 Å is formed between said substrate and said silicon oxide film.

3. A method of manufacturing a thin-film transistor which comprises:

a first step of forming a gate electrode on a main surface of a substrate;

a second step of forming a gate insulating film on said substrate to cover said gate electrode;

a third step of forming a semiconductor film formed on said gate insulating film to cross over said gate electrode; and a fourth step of laminating an interlayer insulting film formed on said semiconductor film, wherein, in said first step, said gate electrode is expanded in width toward said substrate such that said gate electrode forms a trapezoidal cross section, a base angle of said trapezoidal cross section is 20 degrees or less, in said second step, a silicon oxide film is laminated to a thickness of at least 1200 Å, and in said third step, an amorphous semiconductor film is polycrystallized by a laser annealing to form said semiconductor film.

4. The method of manufacturing the thin-film transistor according to claim 3 wherein in said second step, after a silicon nitride film is formed to a thickness of at least 400 Å on said substrate, said silicon oxide film is formed on the silicon nitride film.

\* \* \* \* \*